(12) United States Patent
Tsinker

(10) Patent No.: US 10,608,656 B2
(45) Date of Patent: Mar. 31, 2020

(54) SENSING AN EXTERNAL STIMULUS USING A GROUP OF CONTINUOUS-TIME NYQUIST RATE ANALOG-TO-DIGITAL CONVERTERS IN A ROUND-ROBIN MANNER

(71) Applicant: INVENSENSE, INC., San Jose, CA (US)

(72) Inventor: Vadim Tsinker, Belmont, CA (US)

(73) Assignee: INVENSENSE, INC., San Jose, CA (US)

( * ) Notice: Subject to any disclaimer, the term of this patent is extended or adjusted under 35 U.S.C. 154(b) by 0 days.

(21) Appl. No.: 16/219,812

(22) Filed: Dec. 13, 2018

(65) Prior Publication Data

US 2019/0190535 A1 Jun. 20, 2019

Related U.S. Application Data

(60) Provisional application No. 62/598,549, filed on Dec. 14, 2017.

(51) Int. Cl.
| | |
|---|---|
| *H03M 1/12* | (2006.01) |
| *H03M 1/14* | (2006.01) |
| *H03M 1/34* | (2006.01) |
| *H03M 1/50* | (2006.01) |
| *H03M 1/52* | (2006.01) |

(52) U.S. Cl.
CPC ............ *H03M 1/124* (2013.01); *H03M 1/123* (2013.01); *H03M 1/14* (2013.01); *H03M 1/34* (2013.01); *H03M 1/50* (2013.01); *H03M 1/52* (2013.01); *H03M 2201/2344* (2013.01)

(58) Field of Classification Search
None
See application file for complete search history.

(56) References Cited

U.S. PATENT DOCUMENTS

| | | | | |
|---|---|---|---|---|
| 4,144,527 | A | * | 3/1979 | Butler ................. H03M 1/506 341/136 |
| 5,321,403 | A | * | 6/1994 | Eng, Jr. ................ H03M 1/162 341/168 |
| 5,400,025 | A | * | 3/1995 | Pfeiffer ................. H03M 1/089 341/119 |

(Continued)

*Primary Examiner* — Howard Williams
(74) *Attorney, Agent, or Firm* — Amin, Turocy & Watson, LLP

(57) ABSTRACT

Facilitating a reduction in sensor system latency, circuit size, and current draw utilizing a group of continuous-time Nyquist rate analog-to-digital converters (ADCs) in a round-robin manner is presented herein. A sensor system can comprise a group of sensors that generate respective sensor output signals based on an external excitation of the sensor system; a multiplexer that facilitates a selection, based on a sensor selection input, of a sensor output signal of the respective sensor output signals corresponding to a sensor of the group of sensors; a sense amplifier comprising a charge or voltage sensing circuit that converts the sensor output signal to an analog output signal; and a continuous-time Nyquist rate analog-to-digital converter of the group of continuous-time Nyquist rate ADCs that converts the analog output signal to a digital output signal representing at least a portion of the external excitation of the sensor system.

20 Claims, 11 Drawing Sheets

(56) References Cited

U.S. PATENT DOCUMENTS 5,565,869 A * 10/1996 Brodie ................. H03M 1/162
　　　　　　　　　　　　　　　　　　　341/129
9,329,042 B1 * 5/2016 Cazzaniga ......... G01C 19/5776
9,459,274 B2 10/2016 Shaeffer et al.

* cited by examiner $$Q_{net} = Q_{in} - Q_{de-int} = 0 = \frac{V_{IN}}{R_{in}} * T_{INT} = \frac{V_{ref\_coarse}}{R_{ref\_coarse}} * (T_{coarse}) + \frac{V_{ref\_fine}}{R_{ref\_fine}} * (T_{fine})$$

Since $T_{coarse} \sim Count_{coarse}$ ; $T_{fine} \sim Count_{fine}$ ; $T_{INT} \sim Count_{INT}$ $$V_{IN} = \frac{R_{in}}{R_{ref\_coarse}} \frac{V_{ref\_coarse}}{Count_{INT}} * (Count_{coarse}) + \frac{R_{in}}{R_{ref\_fine}} \frac{V_{ref\_fine}}{Count_{INT}} * (Count_{fine})$$

$$\frac{V_{IN}}{V_{ref\_coarse}} = \frac{R_{in}}{R_{ref\_coarse}} \frac{Count_{coarse}}{Count_{INT}} + \frac{R_{in}}{R_{ref\_fine}} \frac{V_{ref\_fine}}{V_{ref\_coarse}} \frac{Count_{fine}}{Count_{INT}}$$

for $V_{IN\_MAX} = kV_{ref\_coarse}$ $$\frac{V_{IN}}{V_{IN\_MAX}} = \frac{R_{in}}{R_{ref\_coarse}} \frac{1}{k} \frac{Count_{coarse}}{Count_{INT}} + \frac{R_{in}}{R_{ref\_fine}} \frac{1}{k} \frac{V_{ref\_fine}}{V_{ref\_coarse}} \frac{Count_{fine}}{Count_{INT}}$$

Ideally, $\frac{V_{IN}}{V_{IN\_MAX}} = \frac{CF\_ratio}{2^{N-1}} * Count_{coarse} + \frac{1}{2^{N-1}} * Count_{fine}$, where CF_ratio = coarse - to - fine gain ratio and N = # of ADC bits, including sign In this case $$CF\_ratio = 2^{N-1} \frac{R_{in}}{R_{ref\_coarse}} \frac{1}{k} \frac{1}{Count_{INT}}; \text{ where } 2^{N-1} \text{ is the absolute value of the maximum/minimum count}$$

Also $CF\_ratio = \frac{Count_{coarse\_1LSB}}{Count_{fine\_1LSB}} = \left(\frac{R_{in}}{R_{ref\_coarse}} \frac{1}{k}\right) / \left(\frac{R_{in}}{R_{ref\_fine}} \frac{1}{k} \frac{V_{ref\_fine}}{V_{ref\_coarse}}\right) = \frac{R_{ref\_fine}}{R_{ref\_coarse}} \frac{V_{ref\_coarse}}{V_{ref\_fine}}$

FIG. 7

SENSING AN EXTERNAL STIMULUS USING A GROUP OF CONTINUOUS-TIME NYQUIST RATE ANALOG-TO-DIGITAL CONVERTERS IN A ROUND-ROBIN MANNER

RELATED APPLICATION

This patent application claims priority to U.S. Provisional Patent Application No. 62/598,549, filed Dec. 14, 2017, and entitled "CONTINUOUS TIME NYQUIST RATE ADC IN A ROUND-ROBIN SENSOR APPLICATION," the entirety of which application is hereby incorporated by reference herein.

TECHNICAL FIELD

The subject disclosure generally relates to embodiments for sensing an external stimulus using a group of continuous-time Nyquist rate analog-to-digital converters in a round-robin manner.

BACKGROUND

Conventional sensor technologies utilize sigma-delta analog-to-digital converters (ADCs) to digitize sensor signals in sensor applications. Unfortunately, high latency caused by filtering an output of such converters and by addressing quantization noise increases current overhead. In this regard, conventional sensor technologies have had some drawbacks, some of which may be noted with reference to the various embodiments described herein below.

BRIEF DESCRIPTION OF THE DRAWINGS

Non-limiting embodiments of the subject disclosure are described with reference to the following figures, wherein like reference numerals refer to like parts throughout the various views unless otherwise specified:

FIGS. 6-7 illustrate block diagrams of a triple-slope ADC circuit and approximate conditions of operation of such circuit, in accordance with various example embodiments;

DETAILED DESCRIPTION

Figure 1:
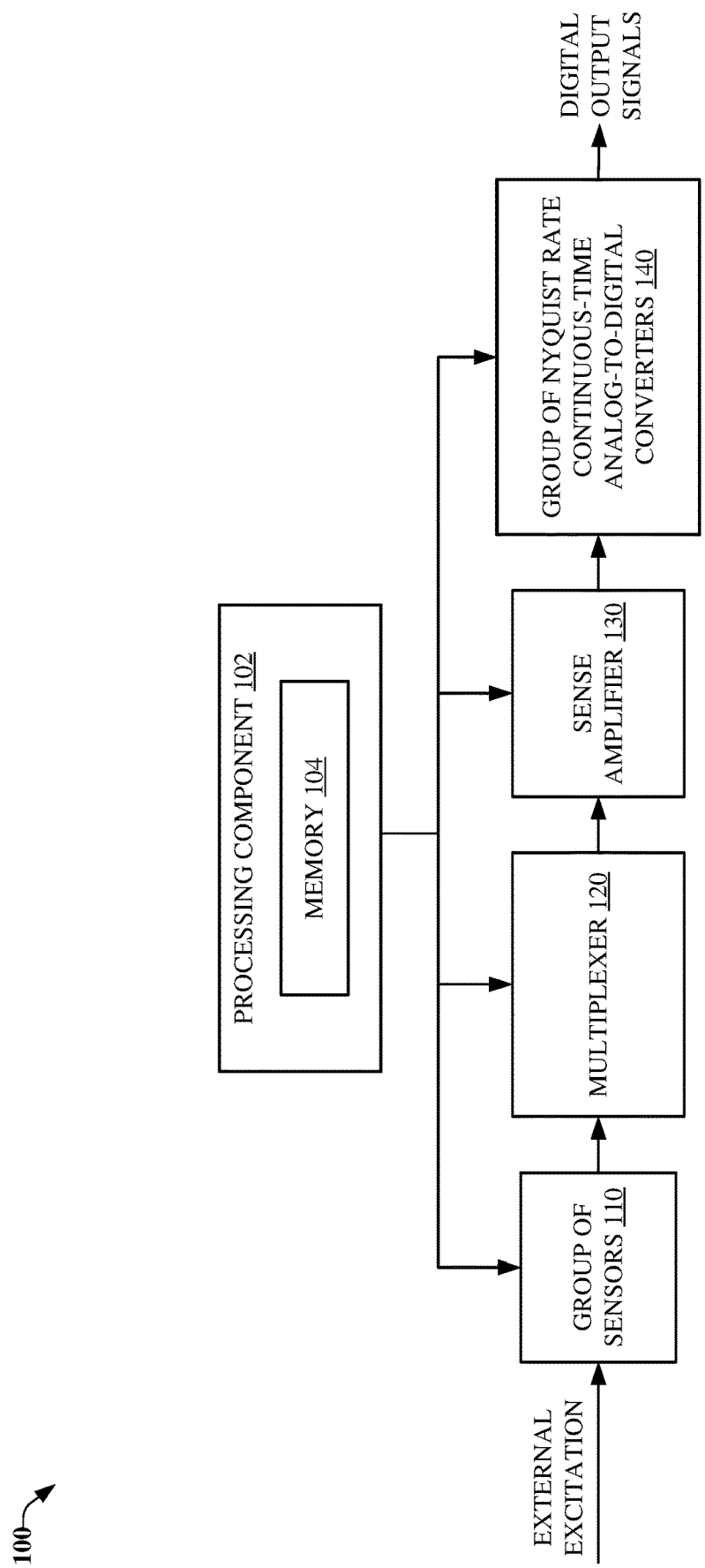
FIG. 1 illustrates a block diagram of a sensor system that facilitates sensing an external stimulus using a group of continuous-time Nyquist rate ADCs in a round-robin manner, in accordance with various example embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

Conventionally, using a sigma-delta ADC for digitizing a sensor signal results in increased system latency and current consumption. On the other hand, various embodiments disclosed herein can reduce sensor system latency, circuit size, and current draw by sensing an external stimulus using a group of continuous-time Nyquist rate ADCs in a round-robin manner.

For example, a system, e.g., sensor system, can comprise a group of sensors that generate respective sensor output signals based on an external excitation of the sensor system; a multiplexer that facilitates a selection, based on a sensor selection input, of a sensor output signal of the respective sensor output signals corresponding to a sensor of the group of sensors; a sense amplifier comprising a charge or voltage sensing circuit that converts the sensor output signal to an analog output signal; and a continuous-time Nyquist rate analog-to-digital converter (ADC) of a group of continuous-time Nyquist rate ADCs that converts the analog output signal to a digital output signal representing at least a portion of the external excitation of the sensor system.

In this regard, in embodiment(s), the multiplexer facilitates, based on the sensor selection input, selection of the respective sensor output signals in a round-robin, e.g., serial, manner. Further, the charge or voltage sensing circuit converts the respective sensor output signals to analog output signals in the round-robin manner. In embodiment(s) described herein, the terms "sample" and "sampling" comprise a combination of the multiplexer selecting, during a defined sampling period based on the sensor selection input, the sensor output signal; the charge or voltage sensing circuit, e.g., C2V converter, converting, amplifying, etc., during the defined sampling period, the sensor output signal to the analog output signal; and the continuous-time Nyquist rate ADC initiating, during the defined sampling period, a conversion, integration, etc. of the analog output signal to the digital output signal. In an embodiment, the defined sampling period is equal, within a defined accuracy, e.g., 1%, to a defined drive period of the sensor.

In one embodiment, a first continuous-time Nyquist rate ADC of the group of continuous-time Nyquist rate ADCs converts, integrates, etc. a first analog output signal—corresponding to a first sensor output signal—to a first digital output signal during the defined sampling period in which the sense amplifier converts, amplifies, etc. a second sensor output signal to a second analog output signal. Further, a second continuous-time Nyquist rate ADC of the group of continuous-time Nyquist rate ADCs initiates a conversion, integration, etc. of the second analog output signal to a second digital output signal in the round-robin manner—during a portion of the defined sampling period.

In another embodiment, the sensor comprises an accelerometer, a gyroscope, a magnetic sensor, a pressure sensor, or a microphone.

In an embodiment, the charge or voltage sensing circuit comprises a charge-to-voltage (C2V) converter that converts the sensor output signal to the analog output signal.

In other embodiment(s), the continuous-time Nyquist rate ADC comprises an integrating ADC, e.g., a multi-slope ADC, a dual-slope ADC, a triple-slope ADC, etc.

In an embodiment, the continuous-time Nyquist rate ADC reduces, according to an increased current consumption, a noise aliasing of the sensor system.

In one embodiment, the respective sensor output signals correspond to respective sensors of the group of sensors corresponding to respective axes of the sensor.

In an embodiment, a method comprises: in response to an external stimulus being applied to a group of sensors of a system comprising a processing component, selecting, by the system via a multiplexer of the system in a serial, e.g., round-robin, manner, a sensor output of a sensor of the group of sensors; converting, amplifying, etc., by the system via a sense amplifier of the system in the serial manner, the sensor output to an analog output representing at least a portion of the external stimulus; and converting, integrating, etc., by the system via a continuous-time Nyquist rate ADC of a group of continuous-time Nyquist rate ADCs of the system, the analog output to a digital output representing the portion of the external stimulus.

In embodiment(s), the converting, amplifying, etc. the sensor output comprises converting, via a charge-to-voltage converter, the sensor output to the analog output.

In other embodiment(s), the converting, amplifying, etc. the sensor output comprises converting the sensor output to the analog output using a voltage sensing circuit.

In yet other embodiment(s), the converting, integrating, etc. the analog output comprises converting the analog output to the digital output using a multi-slope ADC, e.g., a dual-slope ADC, a triple-slope ADC, etc.

In one embodiment, the converting, integrating, etc. comprises: first converting, integrating, etc. via a first continuous-time Nyquist rate ADC of the group of continuous-time Nyquist rate ADCs, a first analog output corresponding to a first sensor of the group of sensors to a first digital output during a first period of time; and second converting, integrating, etc. via a second continuous-time Nyquist rate ADC of the group of continuous-time Nyquist rate ADCs, a second analog output—corresponding to a second sensor of the group of sensors—during a portion of the first period of time.

In another embodiment, the second converting, integrating, etc. comprises initiating the second converting, integrating, etc. during a second period of time that follows the first period of time.

In yet another embodiment, the converting, amplifying, etc. comprises: first converting, by the system via the sense amplifier during a first period of time, a first sensor output of a first sensor of the group of sensors to a first analog output representing at least a first portion of the external stimulus; and second converting, amplifying, etc., by the system via the sense amplifier during a second period of time following the first period of time, a second sensor output of a second sensor of the group of sensors to a second analog output representing at least a second portion of the external stimulus.

Various embodiments disclosed herein can reduce sensor system latency, circuit size, and current draw by sensing an external stimulus using a group of continuous-time Nyquist rate ADCs in a round-robin manner.

Referring now to FIG. 1, a block diagram of a sensor system (100) that facilitates sensing an external stimulus using a group of continuous-time Nyquist rate ADCs (140) in a round-robin manner is illustrated, in accordance with various example embodiments. In this regard, a multiplexer (MUX) (120) can facilitate a selection, based on sensor selection input(s) received from a processing component (102), of a sensor output signal of respective sensor output signals—the sensor output signal corresponding to a sensor of a group of sensors (110). In embodiment(s), the processing component can utilize a memory (104) to store values, intermediate values, etc. (e.g., sensor output signal(s), analog output signal(s), digital output signal(s), etc.) that can be used by various device(s), component(s), circuit(s), etc. of the sensor system.

The group of sensors can generate the respective sensor output signals based on an external excitation, e.g., force, acceleration, pressure, sound, etc. of the sensor system. In embodiment(s), the group of sensors can comprise a micro-electro-mechanical (MEMS) sensor, an accelerometer, a gyroscope, a magnetic sensor (e.g., magnetometer), a pressure sensor (e.g., barometer), a microphone, etc. In other embodiment(s), the group of sensors can comprise the same type of sensor, different types of sensors, etc. In yet other embodiment(s), sensors of the group of sensors can correspond to different axes, e.g., x, y, z, etc. of the sensor system.

A sense amplifier (130) comprising a charge or voltage sensing circuit can convert, e.g., based on sense amplifier input(s) received from the processing component, the sensor output signal to an analog output signal. In this regard, in embodiment(s), the charge or voltage sensing circuit can comprise a C2V converter (not shown) that converts the sensor output signal to the analog output signal. Further, a continuous-time Nyquist rate ADC of the group of continuous-time Nyquist rate ADCs can convert, e.g., based on ADC selection input(s) received from the processing component, the analog output signal to a digital output signal representing at least a portion of the external excitation of the sensor system.

Figure 2:
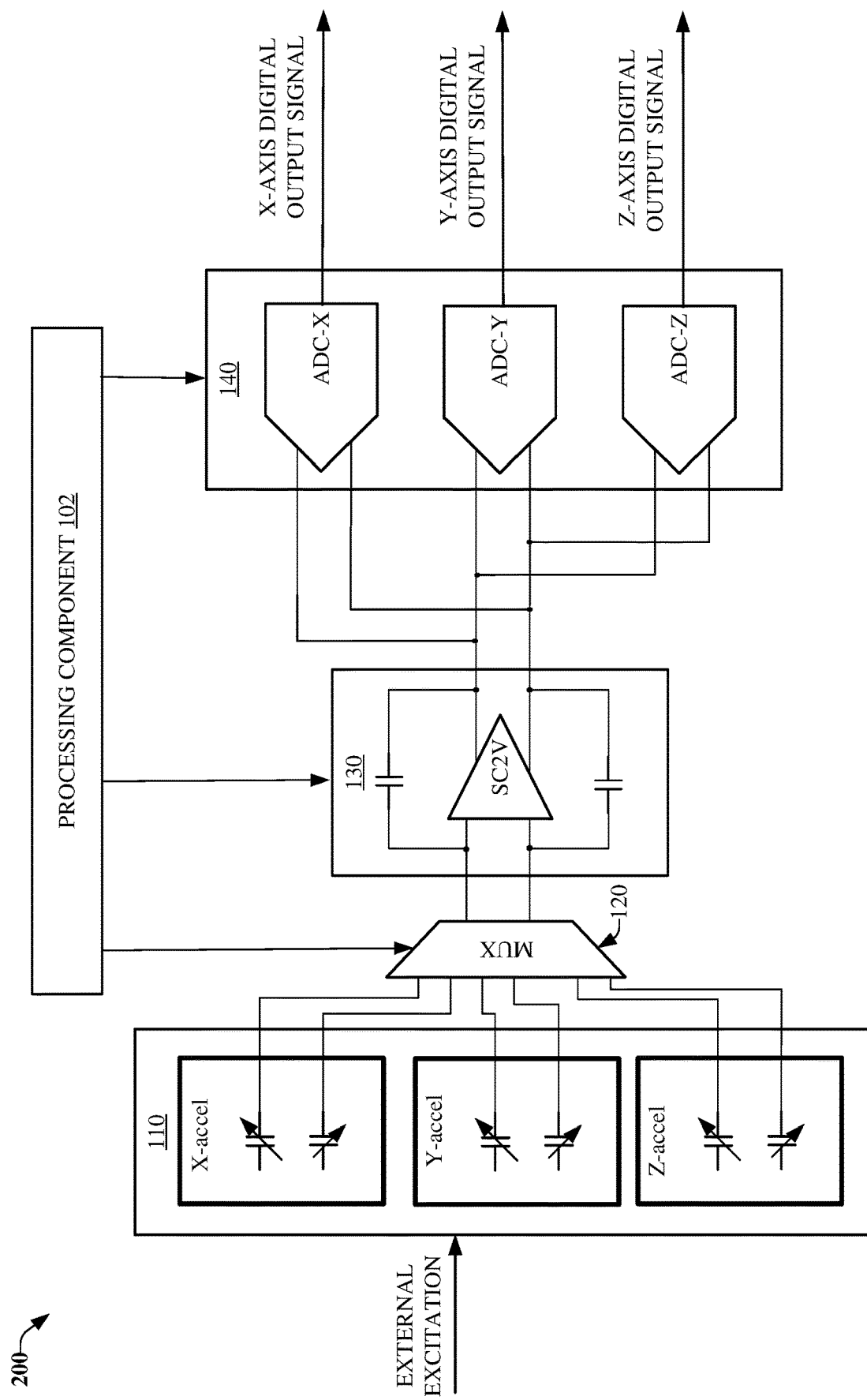
FIG. 2 illustrates a block diagram of a tri-axis sensor system that facilitates sensing an external stimulus using a group of continuous-time Nyquist rate ADCs in a round-robin manner, in accordance with various example embodiments.

For example, in an embodiment illustrated by FIG. 2, the sensor system can comprise sensors, e.g., accelerometers, corresponding to respective axes (e.g., x-axis, y-axis, and z-axis) of the sensor system. In this regard, the MUX can facilitate, based on the sensor selection input(s), respective selections of sensor output signals (e.g., corresponding to an x-axis sensor, a y-axis sensor, and a z-axis sensor) during respective sampling periods (see, e.g., "Sample X", "Sample Y", and "Sample Z" as illustrated by FIG. 7) in a round-robin, e.g., serial, manner. In turn, a sense amplifier C2V (SC2V) converter of the charge or voltage sensing circuit can convert, amplify, etc., based on the sense amplifier input(s), the sensor output signals to respective analog output signals during the respective sampling periods in the round-robin manner. In embodiment(s), a sampling period, e.g., defined sampling period, of the respective sampling periods can be equal, e.g., within a defined accuracy, e.g., 2%, to a defined drive period of the sensors, e.g., 128 kHz.

In embodiment(s), the SC2V delays a period, e.g., a "Break/recover" period, from an end of a first sampling period, e.g., "Sample X", before beginning a second sampling period, e.g., "Sample Y", in order to allow the MUX to complete a selection, based on the sensor selection input(s), of a sensor output signal of the sensor output signals to be sampled in the second sampling period.

In embodiment(s), the terms sample and sampling comprise a combination of the MUX selecting, during a sampling period of the respective sampling periods based on the sensor selection input(s), a sensor output signal of the sensor output signals; and the SC2V converter converting, amplifying, etc., during the sampling period, the sensor output signal to an analog output signal of the analog output signals.

As illustrated by FIG. 2, the group of continuous-time Nyquist rate ADCs (e.g., "ADC-X", "ADC-Y", and "ADC-Z") can correspond to respective sensors, e.g., accelerometers, of the group of sensors. Further, respective inputs of the group of continuous-time Nyquist rate ADCs can be connected to a single-ended/differential output of the MUX in a "wired-or", e.g., open collector, configuration. In this regard, the processing component can selectively initiate, during the sampling period, e.g., Sample X, Sample, Y, Sample Z, etc. based on the ADC selection input(s), a conversion, integration, etc. of the analog output signal to the digital output signal.

Figure 5:
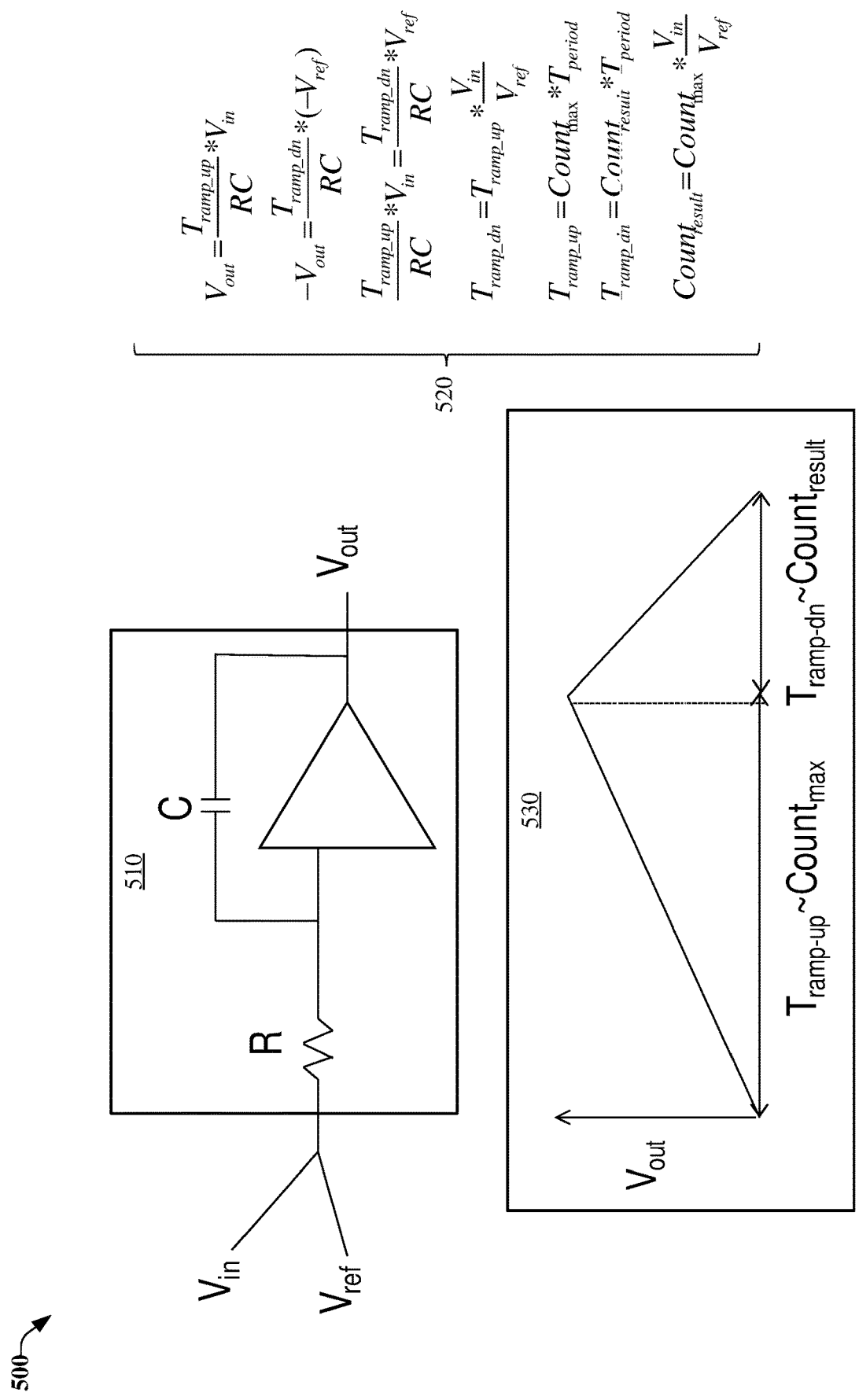
FIG. 5 illustrates a block diagram of a dual-slope ADC circuit and approximate conditions of operation of such circuit, in accordance with various example embodiments.
Figure 6:
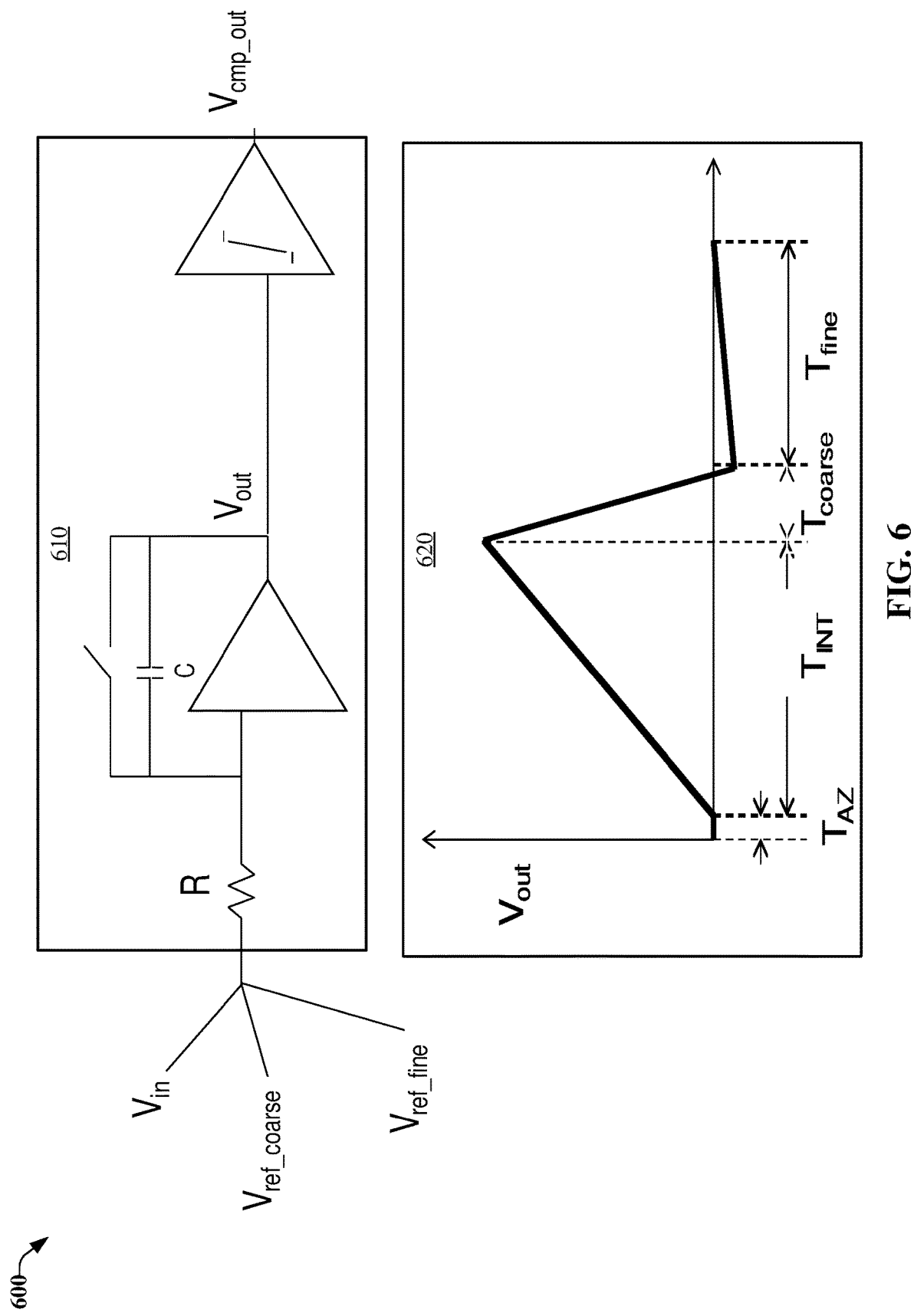

In embodiment(s), the continuous-time Nyquist rate ADC can comprise an integrating ADC, e.g., a multi-slope ADC. For example, in an embodiment illustrated by FIG. 5, the continuous-time Nyquist rate ADC can comprise a dual-slope ADC circuit (510), e.g., operating under conditions, equations, etc. (520) associated with plot 530. In another embodiment illustrated by FIGS. 6 and 7, the continuous-time Nyquist rate ADC can comprise a triple-slope ADC circuit (610), e.g., operating under conditions, equations, etc. (700) associated with plot 620. In this regard, in embodiment(s), the continuous-time Nyquist rate ADC reduces, according to an increased current consumption, a noise aliasing of the sensor system.

Figure 8:
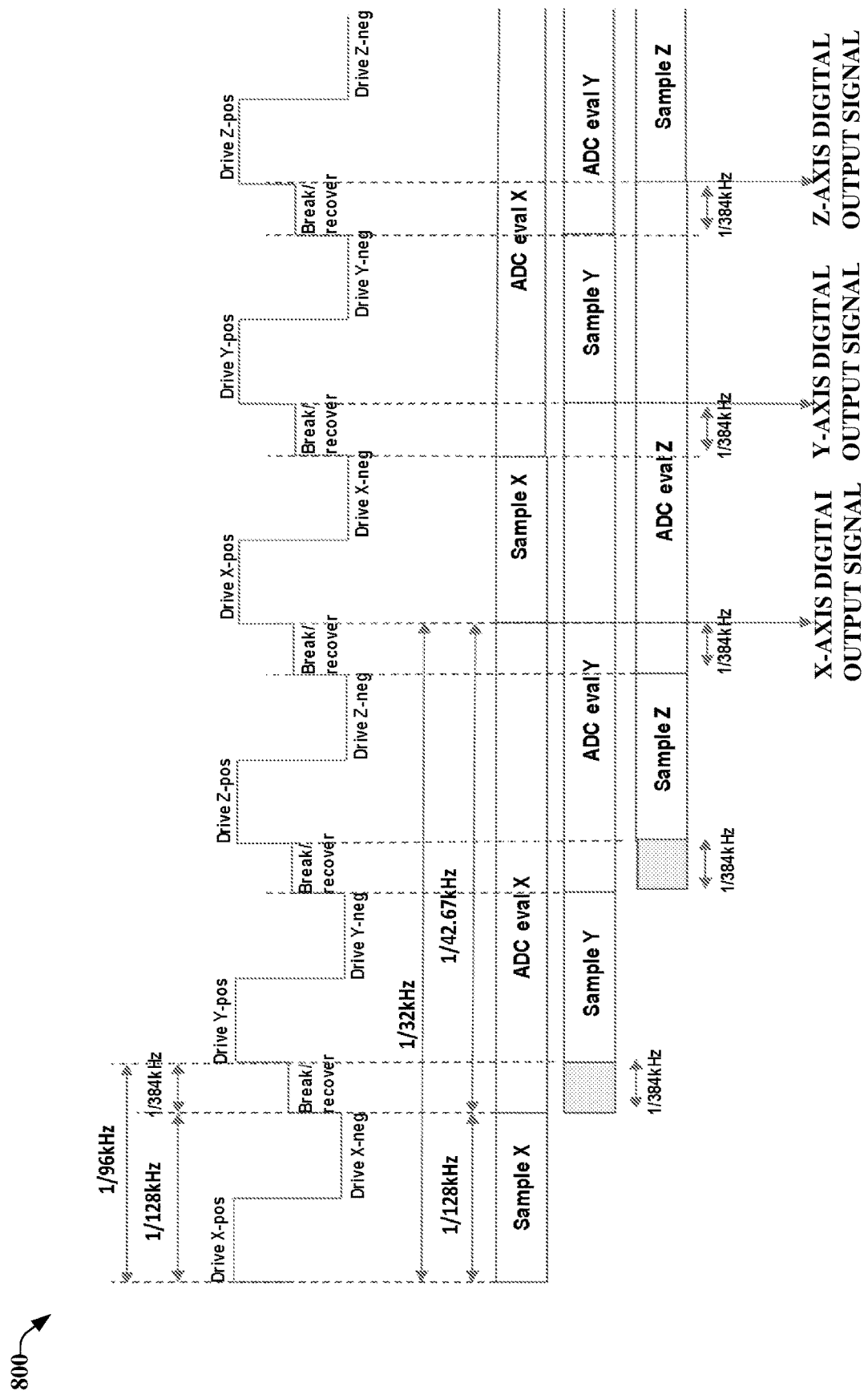
FIG. 8 illustrates a timing diagram of a flowchart of an operation of a sensor system that facilitates sensing an external stimulus using a group of continuous-time Nyquist rate ADCs in a round-robin manner, in accordance with various example embodiments.

Further, as illustrated by FIG. 8, after an initiation of a conversion, integration, etc. of the analog output signal by the continuous-time Nyquist rate ADC, the continuous-time Nyquist rate ADC can continue to convert, integrate, etc. during an ADC conversion period (e.g., "ADC eval X", "ADC eval Y", and "ADC eval Z"), the analog output signal to a digital output signal (see, e.g., "X-AXIS DIGITAL OUTPUT SIGNAL", "Y-AXIS DIGITAL OUTPUT SIGNAL", and "Z-AXIS DIGITAL OUTPUT SIGNAL") representing at least a portion of an acceleration, e.g., x-axis acceleration, y-axis acceleration, z-axis acceleration, etc. of the sensor system corresponding to an accelerometer of the respective accelerometers.

In embodiment(s), a first continuous-time Nyquist rate ADC (e.g., "ADC-X") of the group of continuous-time Nyquist rate ADCs converts, integrates, etc. a first analog output signal (e.g., "Sample X") corresponding to a first sensor output signal of a first sensor (e.g., x-axis accelerometer) to a first digital output signal (e.g., "X-AXIS DIGITAL OUTPUT SIGNAL") during a first evaluation period, e.g., "ADC eval X". Further, the SC2V converter converts, amplifies, etc. a second sensor output signal of a second sensor (e.g., y-axis accelerometer) to a second analog output signal (e.g., "Sample Y") during a portion of the first evaluation period. Further, a second continuous-time Nyquist rate ADC (e.g., "ADC-Y") of the group of continuous-time Nyquist rate ADCs initiates a conversion, integration, etc. of the second analog output signal (e.g., "Sample Y") to a second digital output signal (e.g., "Y-AXIS DIGITAL OUTPUT SIGNAL") in the round-robin manner during another portion of the first evaluation period.

Figure 3:
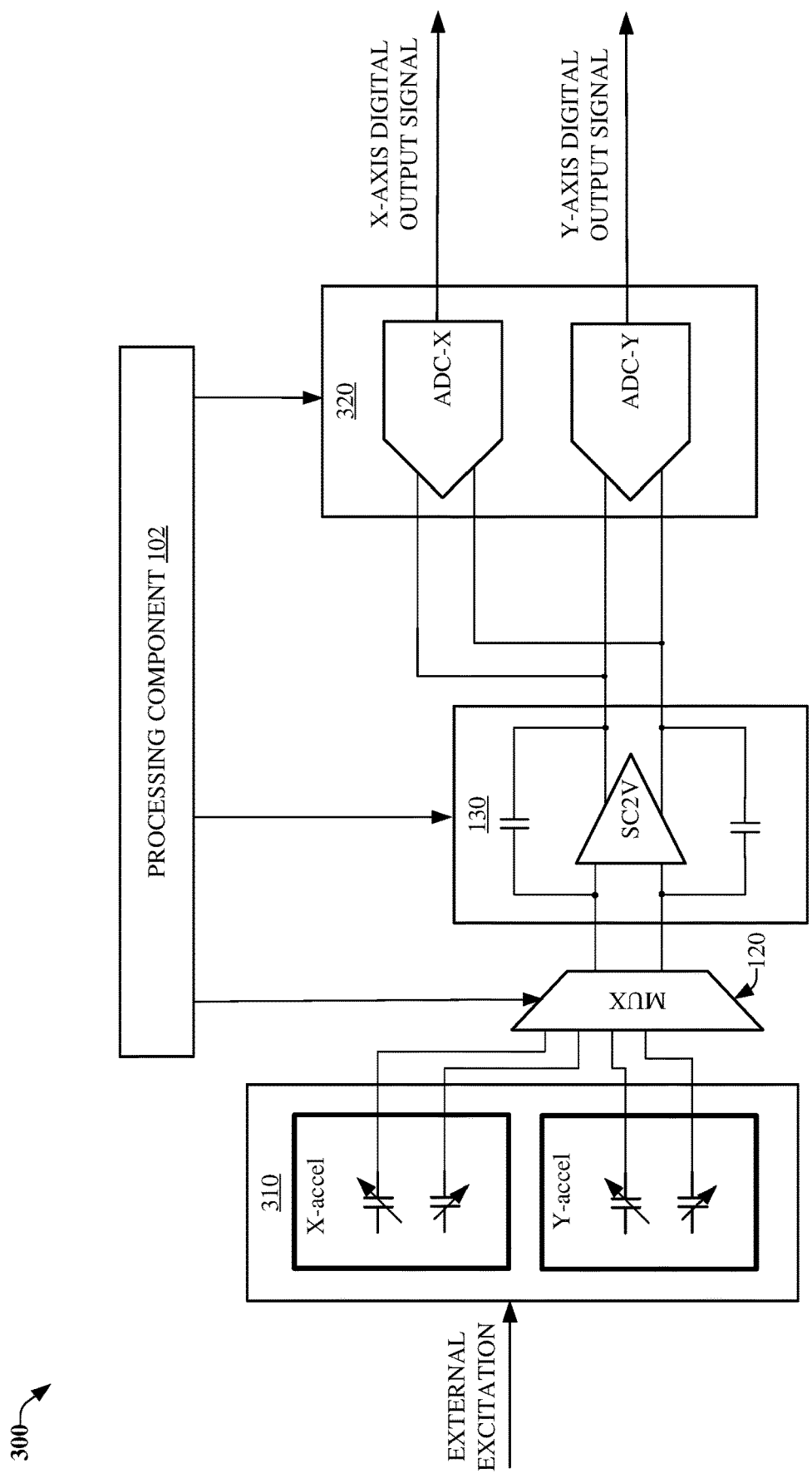
FIG. 3 illustrates a block diagram of a dual-axis sensor system that facilitates sensing an external stimulus using a group of continuous-time Nyquist rate ADCs in a round-robin manner, in accordance with various example embodiments.

Referring now to FIG. 3, a block diagram of a dual-axis sensor system (300) comprising accelerometers (310) corresponding to respective axes (e.g., x-axis, y-axis) of the sensor system is illustrated, in accordance with various example embodiments. In this regard, the MUX can facilitate, based on the sensor selection input(s), respective selections of sensor output signals, e.g., corresponding to an x-axis accelerometer and a y-axis sensor accelerometer, respectively, in a round-robin, e.g., serial, manner.

In turn, the SC2V converter can convert, amplify, etc., based on the sense amplifier input(s), the sensor output signals to respective analog output signals during respective sampling periods in the round-robin manner. In this regard, the processing component can selectively initiate a conversion, integration, etc., via a continuous-time Nyquist rate ADC of a group (320) of continuous-time Nyquist rate ADCs based on the ADC selection input(s), of an analog output signal of the respective analog output signals to a digital output signal (see, e.g., "X-AXIS DIGITAL OUTPUT SIGNAL" and "Y-AXIS DIGITAL OUTPUT SIGNAL") representing at least a portion of an acceleration, e.g., x-axis acceleration or y-axis acceleration, of the sensor system—during a sampling period of the respective sampling periods, e.g., Sample X and Sample Y. Further, the continuous-time Nyquist rate ADC can continue to convert, integrate, etc., during an ADC conversion period (see, e.g., "ADC eval X" and "ADC eval Y"), the analog output signal to the digital output signal.

Figure 4:
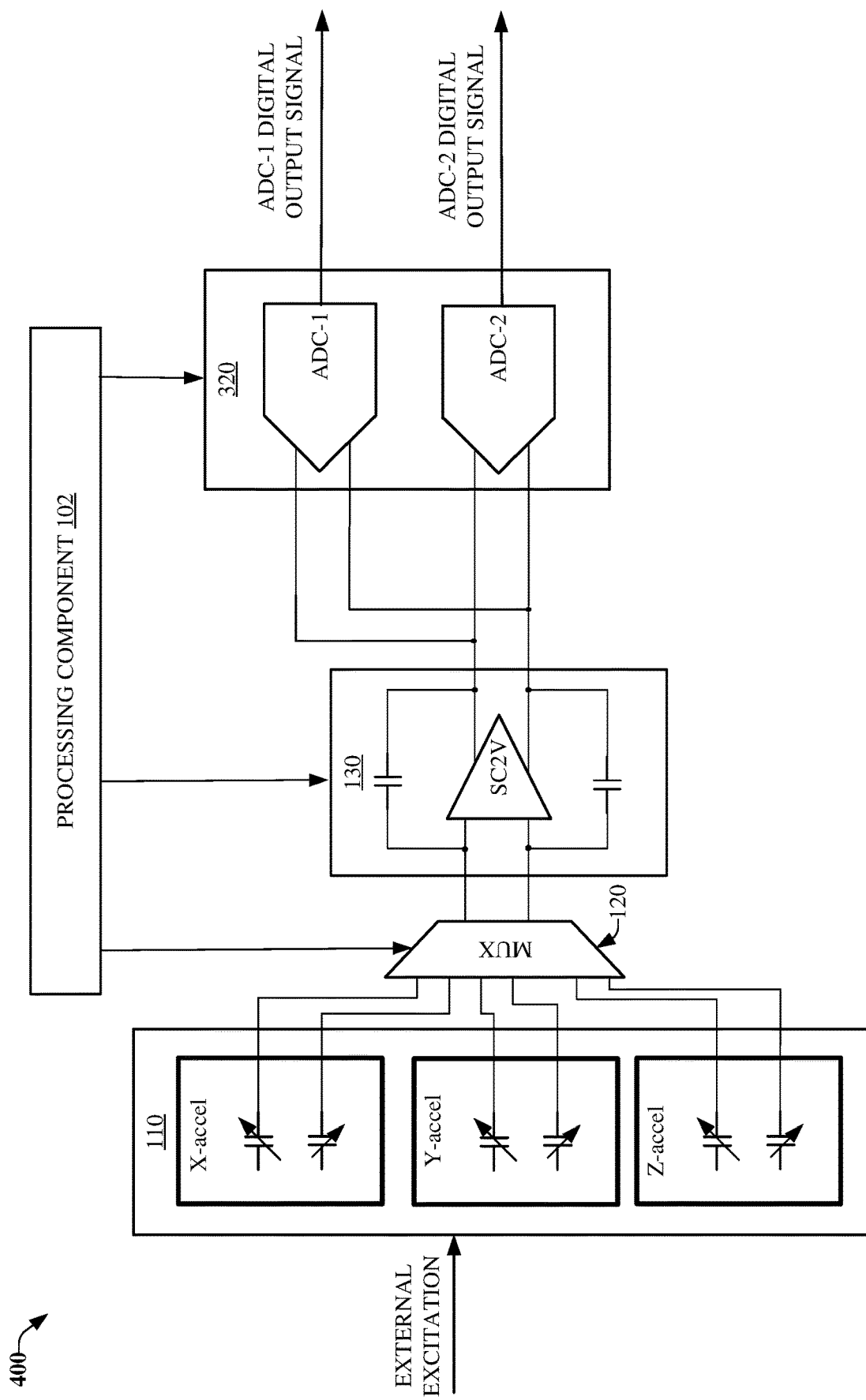
FIG. 4 illustrates a block diagram of a tri-axis sensor system comprising a pair of continuous-time Nyquist rate ADCs, in accordance with various example embodiments.

FIG. 4 illustrates a block diagram of a tri-axis sensor system (400) comprising accelerometers (110) corresponding to respective axes (e.g., x-axis, y-axis, and z-axis) of the system, and comprising a group (320) of continuous-time Nyquist rate ADCs comprising two continuous-time Nyquist rate ADCs (e.g., ADC-1 and ADC-2), in accordance with various example embodiments. The processing component can selectively initiate a conversion, integration, etc., via a continuous-time Nyquist rate ADC of the group (320) of continuous-time Nyquist rate ADCs based on the ADC selection input(s), of an analog output signal of the respective analog output signals during a sampling period of the respective sampling periods (e.g., Sample X, etc.), and convert, during an ADC conversion period (see, e.g., ADC eval X, etc.), the analog output signal to a digital output signal (see, e.g., "ADC-1 DIGITAL OUTPUT SIGNAL" and "ADC-2 DIGITAL OUTPUT SIGNAL") representing at least a portion of an acceleration, e.g., x-axis acceleration, y-axis acceleration, or z-axis acceleration of the sensor system.

In this regard, it should be appreciated that in various embodiment(s) of sensor systems disclosed herein, the number of ADCs of such sensor systems does not have to equal the number of sensors of the sensor systems. For example, as illustrated by FIG. 4, a continuous-time Nyquist-rate ADC (e.g., "ADC-1" and "ADC-2") of the group of continuous-time Nyquist-rate ADCs can "ping-pong" from converting, integrating, etc. an analog output of one sensor (e.g., Y-accel) during one sampling period, ADC conversion period, etc. to converting, integrating, etc. another analog output of another sensor (e.g., Z-accel) during another sampling period, ADC conversion period, etc.

For example, in embodiment(s), ADC-1 and ADC-2 can ping-pong from axis to axis of the tri-axis sensor system during respective cycles as follows (e.g., via processing component controlling the MUX, storing intermediate ADC values in the memory (104), and selecting/configuring respective ADCs—using the sensor selection input(s), the sense amplifier input(s), and the ADC selection input(s)):

$1^{st}$ cycle—ADC-1 samples/initiates an integration of an x-axis analog output corresponding to the x-axis;

$2^{nd}$ cycle—ADC-1 evaluates/integrates the x-axis analog output, and
    ADC-2 samples/initiates an integration of a y-axis analog output corresponding to the y-axis;

$3^{rd}$ cycle—ADC-1 samples/initiates an integration of a z-axis analog output corresponding to the z-axis, and ADC-2 evaluates/integrates the y-axis analog output;

$4^{th}$ cycle—ADC-1 evaluates/integrates the z-axis analog output, and
    ADC-2 samples/initiates an integration of the x-axis analog output;

$5^{th}$ cycle—ADC-1 samples/initiates an integration of the y-axis analog output,
and
    ADC-2 evaluates/integrates the x-axis analog output;

$6^{th}$ cycle—ADC-1 evaluates/integrates the y-axis analog output, and
    ADC-2 samples/initiates an integration of the z-axis analog output;

$7^{th}$ cycle—ADC-1 samples/initiates an integration of the x-axis analog output,
and
    ADC-2 evaluates/integrates the z-axis analog output;

etc.

Figure 9:
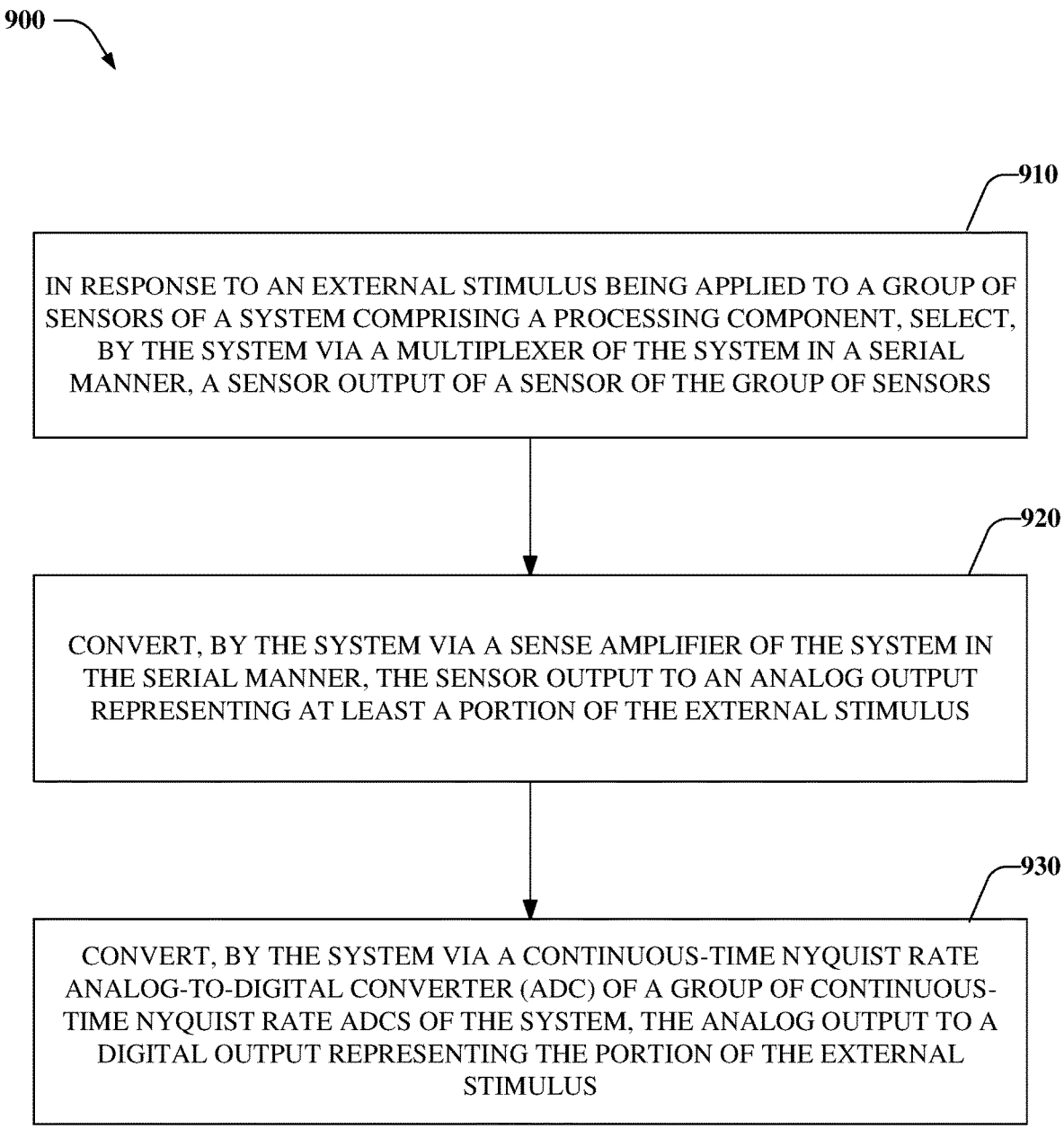
FIG. 9 illustrates a flowchart of a method associated with a sensor system that facilitates sensing an external stimulus using a group of continuous-time Nyquist rate ADCs in a round-robin manner, in accordance with various example embodiments.
Figure 10:
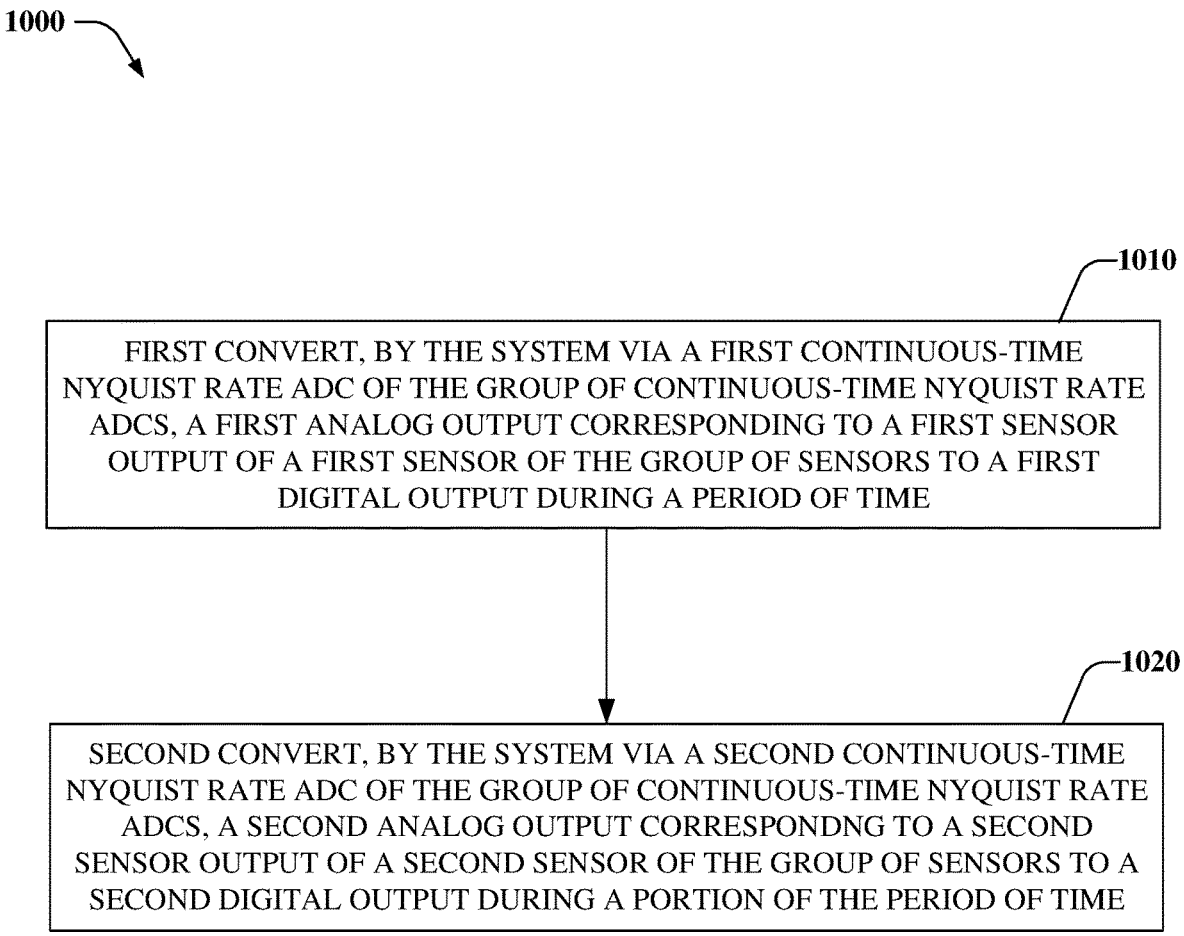
FIG. 10 illustrates a flow chart of another method associated with a sensor system that facilitates sensing an external stimulus using a group of continuous-time Nyquist rate ADCs in a round-robin manner, in accordance with various example embodiments.
Figure 11:
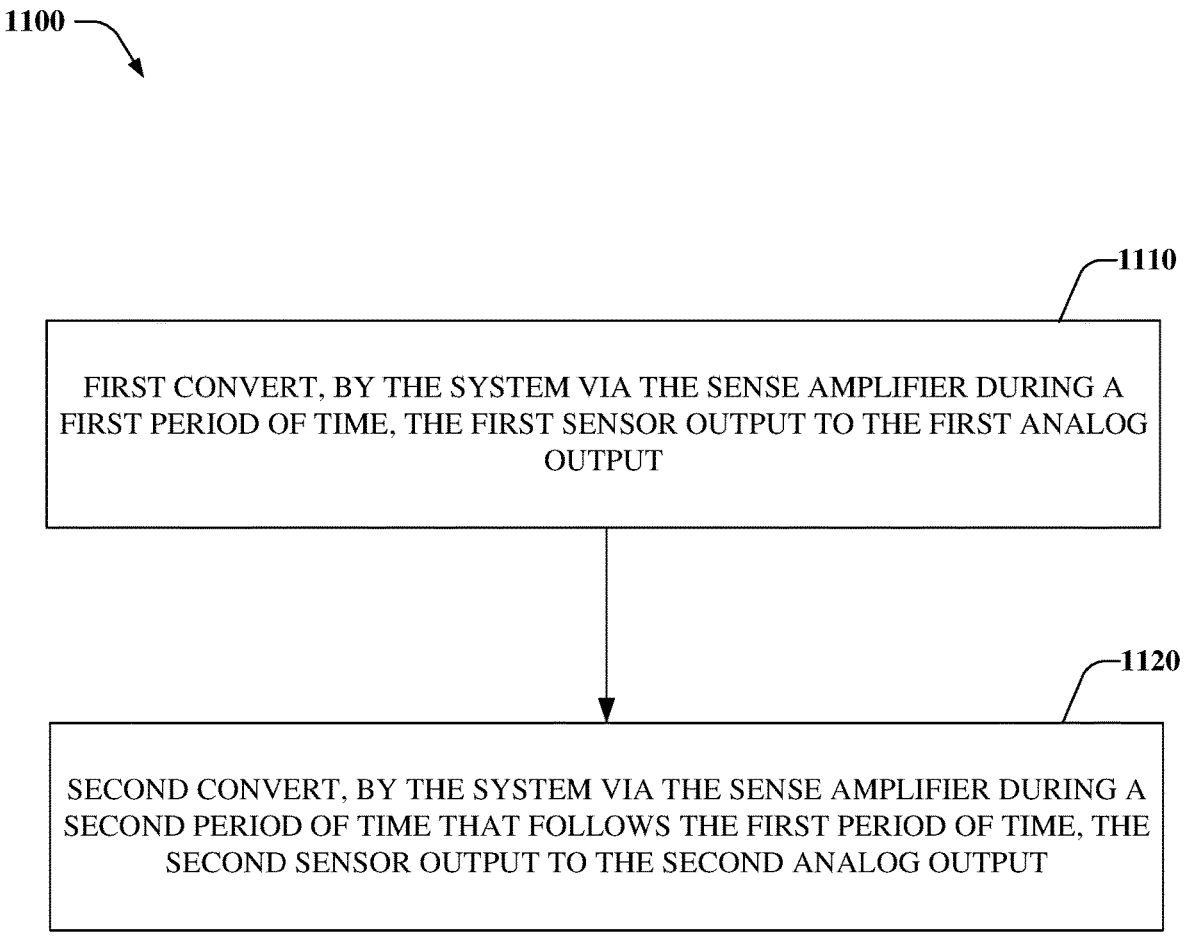
FIG. 11 illustrates a flow chart of yet another method associated with a sensor system that facilitates sensing an external stimulus using a group of continuous-time Nyquist rate ADCs in a round-robin manner, in accordance with various example embodiments.

FIGS. 9-11 illustrate methodologies in accordance with the disclosed subject matter. For simplicity of explanation, the methodologies are depicted and described as a series of acts. It is to be understood and appreciated that various embodiments disclosed herein are not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events.

FIG. 9 illustrates a flowchart of a method associated with a system (e.g., 100) that facilitates sensing an external stimulus using a group of continuous-time Nyquist rate ADCs in a round-robin manner, in accordance with various example embodiments. At 910, in response to an external stimulus being applied to a group of sensors of the system, the system can select, via a MUX of the system in a serial manner, a sensor output of a sensor of the group of sensors. At 920, the system can convert, amplify, etc., via a sense amplifier of the system in the serial manner, the sensor output to an analog output representing at least a portion of the external stimulus. At 930, the system can convert, integrate, etc., via a continuous-time Nyquist rate ADC of a group of continuous-time Nyquist rate ADCs of the system, the analog output to a digital output representing the portion of the external stimulus.

FIG. 10 illustrates a flow chart of another method associated with the system that facilitates sensing an external stimulus using a group of continuous-time Nyquist rate ADCs in a round-robin manner, in accordance with various example embodiments. At 1010, the system can first convert, integrate etc., via a first continuous-time Nyquist rate ADC of the group of continuous-time Nyquist rate ADCs, a first analog output corresponding to a first sensor output of a first sensor of the group of sensors to a first digital output during a period of time.

At 1020, the system can second convert, integrate, etc., via a second continuous-time Nyquist rate ADC of the group of continuous-time Nyquist rate ADCs, a second analog output corresponding to a second sensor output of a second sensor of the group of sensors to a second digital output during a portion of the period of time.

FIG. 11 illustrates a flow chart of yet another method associated with the system that facilitates sensing an external stimulus using a group of continuous-time Nyquist rate ADCs in a round-robin manner, in accordance with various example embodiments. At 1110, the system can first convert, amplify, etc., via the sense amplifier during a first period of time, the first sensor output to the first analog output. Further, at 1120, the system can second convert, amplify, etc., via the sense amplifier during a second period of time that follows the first period of time, the second sensor output to the second analog output.

As it employed in the subject specification, the term "circuit" refers to substantially any analog and/or digital based device(s), circuit(s), etc. comprising, e.g., a resistor, a capacitor, a transistor, a diode, an inductor, a memory, a programmable device, e.g., fuse, field programmable gate array (FPGA), complex programmable logic device (CPLD), etc. relevant to performing operations and/or functions of circuit(s), device(s), system(s), etc. disclosed herein. Further, the term "processing component" can refer to substantially any computing processing unit or device (e.g., MAC, etc.), comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an ASIC, a digital signal processor (DSP), an FPGA, a programmable logic controller (PLC), a CPLD, a discrete gate or transistor logic, discrete hardware components, an analog circuit, or any combination thereof designed to perform the functions and/or processes described herein. Further, a processor can exploit nano-scale architectures such as, but not limited to, molecular and quantum-dot based transistors, switches and gates, e.g., in order to optimize space usage or enhance performance of mobile devices. A processor can also be implemented as a combination of computing processing units, devices, etc.

In the subject specification, the term "memory" and substantially any other information storage component relevant to operation and functionality of system 100 and/or devices (e.g., group of sensors 110) disclosed herein refer to "memory components," or entities embodied in a "memory," or components comprising the memory (e.g. 104). It will be appreciated that the memory can include volatile memory and/or nonvolatile memory. By way of illustration, and not limitation, volatile memory, can include random access memory (RAM), which can act as external cache memory. By way of illustration and not limitation, RAM can include synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM). In other embodiment(s) nonvolatile memory can include read only memory (ROM), programmable ROM (PROM), electrically programmable ROM (EPROM), electrically erasable ROM (EEPROM), or flash memory. Additionally, the components and/or devices disclosed herein can comprise, without being limited to comprising, these and any other suitable types of memory.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Aspects of systems, apparatus, devices, processes, and process blocks explained herein can be embodied within hardware, such as an ASIC or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art having the benefit of the instant disclosure.

The above description of illustrated embodiments of the subject disclosure is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A sensor system, comprising:
    a group of sensors that generate respective sensor output signals based on an external excitation of the sensor system;
    a multiplexer that selects, based on a sensor selection input, a sensor output signal of the respective sensor output signals corresponding to a sensor of the group of sensors;
    a sense amplifier comprising a charge or voltage sensing circuit that converts the sensor output signal to an analog output signal; and
    a continuous-time Nyquist rate analog-to-digital converter (ADC) of a group of continuous-time Nyquist rate ADCs that converts the analog output signal to a digital output signal representing at least a portion of the external excitation of the sensor system, wherein respective inputs of the continuous-time Nyquist rate ADCs are connected, in a wired-or configuration, to an output of the sense amplifier comprising the analog output signal.

2. The sensor system of claim 1, wherein the sensor comprises an accelerometer, a gyroscope, a magnetic sensor, a pressure sensor, or a microphone.

3. The sensor system of claim 1, wherein the charge or voltage sensing circuit comprises a charge-to-voltage (C2V) converter that converts the sensor output signal to the analog output signal.

4. The sensor system of claim 1, wherein the continuous-time Nyquist rate ADC comprises an integrating ADC.

5. The sensor system of claim 4, wherein the integrating ADC comprises a multi-slope ADC.

6. The sensor system of claim 5, wherein the multi-slope ADC is a dual-slope ADC.

7. The sensor system of claim 5, wherein the multi-slope ADC is a triple-slope ADC.

8. The sensor system of claim 1, wherein the continuous-time Nyquist rate ADC reduces, according to an increased current consumption, a noise aliasing of the sensor system.

9. The sensor system of claim 1, wherein the multiplexer facilitates, based on the sensor selection input, respective selections, comprising the selection, of the respective sensor output signals in a round-robin manner, and wherein the charge or voltage sensing circuit converts the respective sensor output signals to respective analog output signals comprising the analog output signal in the round-robin manner.

10. The sensor system of claim 1, wherein the sensor output signal is a first sensor output signal, wherein the analog output signal is a first analog output signal, and wherein the continuous-time Nyquist rate ADC converts the first analog output signal to the digital output signal during a period of time in which the sense amplifier converts a second sensor output signal of the respective sensor output signals to a second analog output signal.

11. The sensor system of claim 10, wherein the continuous-time Nyquist rate ADC is a first continuous-time Nyquist rate ADC, wherein the digital output signal is a first digital output signal, wherein the portion is a first portion, and wherein a second continuous-time Nyquist rate ADC of the group of continuous-time Nyquist rate ADCs converts the second analog output signal to a second digital output signal during a second portion of the period of time.

12. The sensor system of claim 1, wherein the respective sensor output signals correspond to respective sensors of the group of sensors corresponding to respective axes of the sensor.

13. The sensor system of claim 1, wherein a defined sampling period of the charge or voltage sensing circuit is equal, within a defined accuracy, to a defined drive period of the sensor.

14. A method, comprising:
in response to an external stimulus being applied to a group of sensors of a system comprising a processing component, selecting, by the system via a multiplexer of the system in a serial manner, a sensor output of a sensor of the group of sensors;
converting, by the system via a sense amplifier of the system in the serial manner, the sensor output to an analog output representing at least a portion of the external stimulus; and
converting, by the system via a continuous-time Nyquist rate analog-to-digital converter (ADC) of a group of continuous-time Nyquist rate ADCs of the system, the analog output to a digital output representing the portion of the external stimulus, wherein the continuous-time Nyquist rate ADCs are connected to an output of the sense amplifier comprising the analog output in an open collector configuration.

15. The method of claim 14, wherein the converting the sensor output to the analog output comprises:
converting, via a charge-to-voltage converter, the sensor output to the analog output.

16. The method of claim 14, wherein the converting the sensor output to the analog output comprises:
converting the sensor output to the analog output using a voltage sensing circuit.

17. The method of claim 14, wherein the converting the analog output to the digital output comprises:
converting the analog output to the digital output using a multi-slope ADC.

18. The method of claim 14, wherein the sensor is a first sensor, wherein the analog output is a first analog output, wherein the digital output is a first digital output, wherein the continuous-time Nyquist rate ADC is a first continuous-time Nyquist rate ADC, and wherein the converting the first analog output comprises:
first converting, via the first continuous-time Nyquist rate ADC, the first analog output to the first digital output during a period of time; and
second converting, via a second continuous-time Nyquist rate ADC of the group of continuous-time Nyquist rate ADCs, a second analog output corresponding to a second sensor of the group of sensors to a second digital output during a portion of the period of time.

19. The method of claim 18, wherein the period of time is a first period of time, and wherein the second converting comprises:
initiating the second converting during a second period of time that follows the first period of time.

20. The method of claim 14, wherein the sensor is a first sensor, wherein the sensor output is a first sensor output, wherein the analog output is a first analog output, wherein the portion is a first portion, and wherein the converting the first sensor output comprises:
first converting, by the system via the sense amplifier during a first period of time, the first sensor output of the first sensor to the first analog output; and
second converting, by the system via the sense amplifier during a second period of time that follows the first period of time, a second sensor output of a second sensor of the group of sensors to a second analog output representing at least a second portion of the external stimulus.

* * * * *